United States Patent
Choi et al.

(10) Patent No.: US 9,733,278 B2
(45) Date of Patent: Aug. 15, 2017

(54) SYSTEM FOR MEASURING LOSS OF HVDC

(71) Applicant: LSIS CO., LTD., Anyang-si, Gyeonggi-do (KR)

(72) Inventors: Yong Kil Choi, Gunpo-si (KR); Eun Jae Lee, Seoul (KR)

(73) Assignee: LSIS CO., LTD., Anyang-si (KR)

(*) Notice: Subject to any disclaimer, the term of this patent is extended or adjusted under 35 U.S.C. 154(b) by 91 days.

(21) Appl. No.: 14/683,029

(22) Filed: Apr. 9, 2015

(65) Prior Publication Data
US 2015/0293152 A1    Oct. 15, 2015

(30) Foreign Application Priority Data

Apr. 14, 2014  (KR) .......................... 10-2014-0044152

(51) Int. Cl.
*G01R 15/18*     (2006.01)
*H02J 3/36*      (2006.01)
(Continued)

(52) U.S. Cl.
CPC ............. *G01R 15/18* (2013.01); *H02J 3/18* (2013.01); *H02J 3/36* (2013.01); *G01R 21/06* (2013.01);
(Continued)

(58) Field of Classification Search
CPC ............ G01R 21/06; G01R 15/18; H02J 3/36
(Continued)

(56) References Cited

U.S. PATENT DOCUMENTS 2,125,983 A * 8/1938 Bettison ................. G01N 27/83
 324/113
4,065,793 A * 12/1977 Maxwell, Jr. .......... G11B 20/18
 324/113
(Continued)

FOREIGN PATENT DOCUMENTS

CN    102175923    9/2011
JP    60-223434    11/1985
(Continued)

OTHER PUBLICATIONS

Boggs, S. A., and N. Fujimoto. "Techniques and instrumentation for measurement of transients in gas-insulated switchgear." IEEE transactions on electrical insulation 2 (1984): 87-92.*
(Continued)

*Primary Examiner* — Jermele M Hollington
*Assistant Examiner* — Christopher McAndrew
(74) *Attorney, Agent, or Firm* — Lee, Hong, Degerman, Kang & Waimey PC

(57) ABSTRACT

A system for measuring a loss in power between a power transmission side and a power reception side in a high voltage direct current (HVDC) system is provided. The system for measuring the loss in power includes: a first loss measurement unit installed at the power transmission side, and a second loss measurement unit installed at the power reception side, wherein each of the first and second loss measurement units is installed at a location at which a current or voltage is measured, and includes a voltage sensor for measuring a voltage, a current sensor for measuring a current, a GPS module for providing time information on when measurement is performed by the voltage sensor and the current sensor, and a storage unit storing the time information along with a voltage value and a current value measured by the voltage sensor and the current sensor.

11 Claims, 5 Drawing Sheets

(51) Int. Cl.
*H02J 3/18* (2006.01)
*G01R 21/06* (2006.01)
*G01R 21/133* (2006.01)
*G01R 31/08* (2006.01)

(52) U.S. Cl.
CPC .......... *G01R 21/133* (2013.01); *G01R 31/086* (2013.01); *Y02E 40/30* (2013.01); *Y02E 60/60* (2013.01)

(58) Field of Classification Search
USPC ........................................................ 324/113
See application file for complete search history.

(56) References Cited

U.S. PATENT DOCUMENTS

| | | | | |
|---|---|---|---|---|
| 4,362,986 A | * | 12/1982 | Burke | G01R 31/024 324/113 |
| 4,618,923 A | * | 10/1986 | Meisel | H01L 25/112 257/E25.025 |
| 4,835,648 A | * | 5/1989 | Yamauchi | H02B 1/24 218/68 |
| 5,465,203 A | * | 11/1995 | Bhattacharya | H02J 3/01 307/105 |
| 5,731,965 A | * | 3/1998 | Cheng | H02J 3/01 307/105 |
| 6,157,136 A | * | 12/2000 | Wang | H03K 17/955 315/158 |
| 7,075,308 B2 | * | 7/2006 | Rockwell | G01R 31/085 324/113 |
| 7,412,338 B2 | * | 8/2008 | Wynans | G01D 4/006 324/113 |
| 2010/0301872 A1 | | 12/2010 | Kereit et al. | |
| 2011/0093124 A1 | | 4/2011 | Berggren et al. | |

FOREIGN PATENT DOCUMENTS

| | | |
|---|---|---|
| JP | 05-146062 | 6/1993 |
| JP | 2010-521955 | 6/2010 |
| JP | 2011-013032 | 1/2011 |
| JP | 2012-010530 | 1/2012 |
| KR | 10-2003-0037499 | 5/2003 |
| KR | 10-2003-0095124 | 12/2003 |
| KR | 10-2013-0035458 | 4/2013 |
| KR | 10-2014-0008768 | 1/2014 |
| KR | 10-2014-0036552 | 3/2014 |
| WO | 2014/064147 | 5/2014 |

OTHER PUBLICATIONS

Translation of CN102175923.*
European Patent Office Application Serial No. 15163152.0, Search Report dated Sep. 10, 2015, 10 pages.
Schettler, et al., "Roadmap to the Supergrid Technologies," XP055050565, Mar. 2012, 90 pages.
Korean Intellectual Property Office Application Serial No. 10-2014-0044152, Office Action dated Apr. 10, 2015, 4 pages.
Japan Patent Office Application Serial No. 2015-082333, Office Action dated Jan. 5, 2016, 4 pages.

* cited by examiner

SYSTEM FOR MEASURING LOSS OF HVDC

CROSS REFERENCE TO RELATED APPLICATIONS

Pursuant to 35 U.S.C. §119(a), this application claims the benefit of earlier filing date and right of priority to Korean Patent Application No. 10-2014-0044152, filed on Apr. 14, 2014, the contents of which are all hereby incorporated by reference herein in its entirety.

BACKGROUND

The present disclosure relates to a high voltage direct current (HVDC) system, and more particularly, to a system that may more accurately measure and monitor power loss in HVDC.

HVDC transmission is a technology for increasing power transmission efficiency by minimizing power loss in transmitting power to the remote site. HVDC is being recently used for transmitting power between Haenam-gun and Jeju-island and to this end, an HVDC conversion station is installed and operated in each region.

Also, HVDC transmission is easier to perform long-distance large amount power transmission due to little loss compared with typical AC transmission, is economically advantageous because it is possible to lower an insulation level, it is possible to increase power transmission efficiency, and it is possible to enhance stability.

However, in order to perform HVDC transmission, a lot of initial investment costs related to a high-voltage rectifying valve, an inverter converter, and a control facility for reactive power control are consumed, so many related researches are being continued.

FIG. 1 represents an AC power system associated with a typical HVDC system.

As shown in FIG. 1, a filter 11 or a capacitor 12 is generally included in order to compensate for reactive power in the AC power system associated with the HVDC system. When the reactive power in a transient state is compensated for, a condenser bank 13, a static reactive power compensator 14, a static synchronous compensator (STATCOM) 15, or a synchronous compensator 16 is controlled in association with a bus in the AC power system associated with the HVDC system.

Although through such a structure, there is an effort to implement an efficient system operation such as reactive power compensation, a device capable of accurately determining/detecting the power efficiency of the HVDC system has not yet been provided. That is, a method of evaluating an actually constructed HVDC system, or a system accurately determining the loss ratio between the power transmission and reception sides of HVDC has not been composed.

Since the HVDC system is a system that converts a voltage and current and supplies power from a power transmission side to a power reception side in association with a power system network, there is a need to evaluate the completeness and performance of the system when system composition is completed.

That is, a loss and a rate of operation are considered important factors in terms of system performance and completeness. In order to supply power needed by a consumer (load) from the power transmission side, power loss necessarily occurs due to the conversion of power in the power transmission process between the power transmission side and the power reception side, an increase in the length of a power transmission line, and environmental factors. In this case, when great loss occurs, the performance and efficiency of a system participating in power transmission also increase.

The HVDC system is one of power transmission systems specializing in power transmission, and needs the processes of measuring loss occurring in a system and determining whether the system matches a performance standard when system composition is completed.

SUMMARY

Embodiments provide a system that may more accurately measure a loss in power between a power transmission side and a power reception side in an HVDC system, and in particular, a system that may accurately measure power loss on a desired point at an accurate time, because a loss measurement unit according to an embodiment may be freely installed at a desired location in an HVDC system and it is possible to match measurement times of loss measurement units.

In one embodiment, a system for measuring a loss in power between a power transmission side and a power reception side in a high voltage direct current (HVDC) system includes: a first loss measurement unit installed at the power transmission side, and a second loss measurement unit installed at the power reception side, wherein each of the first and second loss measurement units is installed at a location at which a current or voltage is measured, and includes a voltage sensor for measuring a voltage, a current sensor for measuring a current, a GPS module for providing time information on when measurement is performed by the voltage sensor and the current sensor, and a storage unit storing the time information along with a voltage value and a current value measured by the voltage sensor and the current sensor.

The first and second loss measurement units may measure the current value or the voltage value to store the values along with the time information according to a user request or regularly.

The first and second loss measurement units may also store identification information identifying the loss measurement units.

The first and second loss measurement units may further include communication modules enabling data communication with an external device, and the first and second loss measurement units may use the communication modules to transmit measured time information along with the current value and the voltage value measured according to a user request or regularly.

It is possible to check the performance of the HVDC system by the above-described embodiment, which may guarantee performance for a company providing the HVDC system and a company using the system. That is, by providing the loss measurement unit according to the embodiment in plurality in the HVDC system, there are advantages in that it is possible to accurately find out at which location on the path between the loss measurement units the power loss occurs, and it is possible to accurately calculate a power loss value because the loss measurement units use time information having no difference.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

In the following, an embodiment is discussed in detail with reference to the accompanying drawings.

Figure 1:
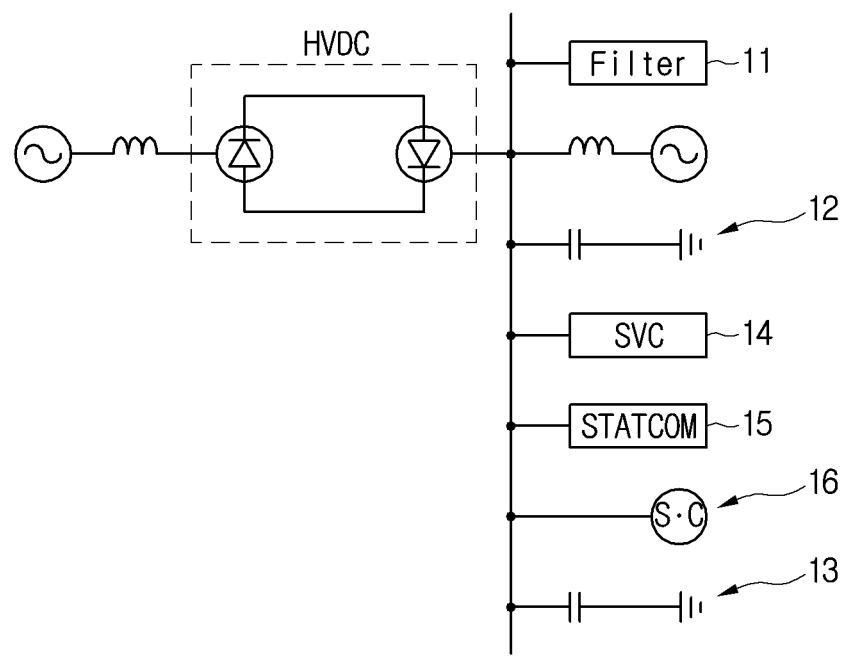
FIG. 1 represents an AC power system associated with a typical HVDC system.
Figure 2:
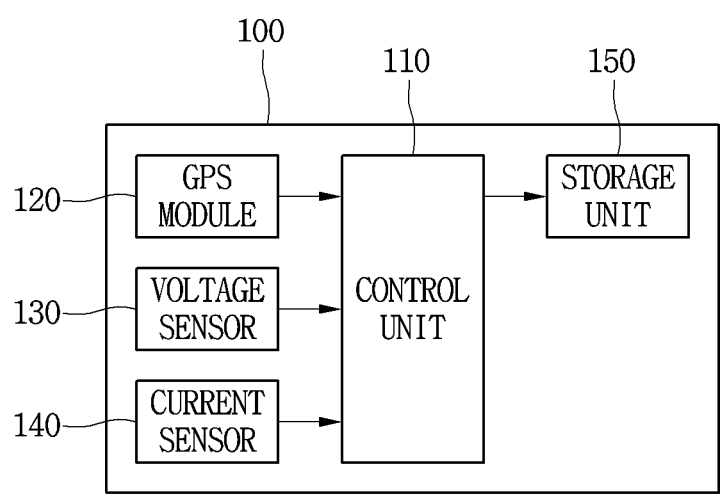
FIG. 2 shows the configuration of a loss measurement unit according to an embodiment.
Figure 3:
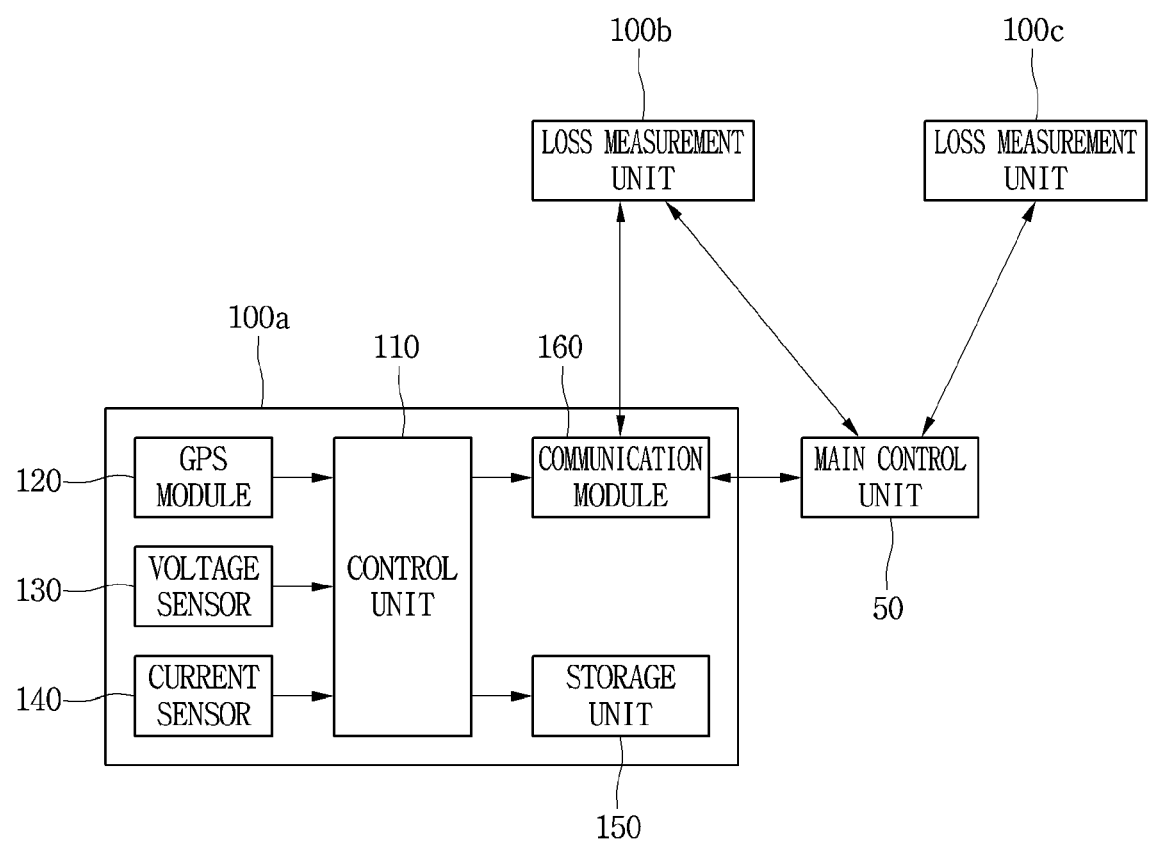
FIG. 3 shows the configuration of a loss measurement unit according to another embodiment, and a system configuration.

FIG. 2 shows the configuration of a loss measurement unit according to an embodiment, and FIG. 3 shows the configuration of a loss measurement unit according to another embodiment, and a system configuration.

Firstly, a loss measurement unit 100 according to an embodiment is described with reference to FIG. 2.

The loss measurement unit 100 may be freely installed at locations in an HVDC system at which a voltage or current may be measured. In addition, the loss measurement unit 100 includes a voltage sensor 130 and current sensor 140 for measuring the voltage or current of power transmitted (received). The voltage sensor 130 is a potential transformer and measures the size of a voltage applied to a wire, and the current sensor 140 is a current transformer and measures the size of a current flowing in the wire.

In addition, the loss measurement unit 100 includes a GPS module 120 and the measurement times of the loss measurement units may be synchronized by using the GPS module 120. That is, each of the loss measurement units may use the built-in GPS module to match voltage or current measurement times. In addition, a storage unit 150 storing a voltage value or current value measured by the voltage sensor 130 or current sensor 140 along with time information measured through the GPS module 120 is included in the loss measurement unit 100.

Also, the loss measurement unit 100 includes a control unit 110 for controlling each component and the control unit 110 stores the voltage value and current value measured by the voltage sensor 130 and the current sensor 140 in the storage unit 150 when there is a user request or regularly, in which case a corresponding measurement time is stored together through the GPS module 120.

As a result, since the GPS module 120 is used, a difference in measurement time between the loss measurement units decreases, which may thus mean that measurement time synchronization has been performed.

When a loss measurement unit 100 measures the voltage value and current value of a connected wire and records them in the storage unit 150, the control unit 110 may store the identification information on a corresponding measurement unit 100 along with a measurement time. In this example, the identification information of the loss measurement unit 100 is information for identifying each of the loss measurement units and a unique number may be assigned as the identification information to each loss measurement unit. In this case, a corresponding unique number, a measurement time and measured voltage/current values may be together stored in the storage unit 150.

Since the loss measurement unit in FIG. 2 may be considered that it has no communication function, the loss measurement unit regularly measures a voltage value and a current value on a corresponding line and stores a synchronized measurement time along with the measured values in the storage unit 150. In this case, since there is no difference in measurement time even when compared to data stored in the storage unit in a loss measurement unit having another location, it is possible to easily calculate a difference in power (loss) between a corresponding loss measurement unit and another loss measurement unit.

That is, a company providing HVDC needs to guarantee power efficiency equal to or higher than a certain level to a customer who uses the HVDC. In this case, it is possible to determine a loss level at a synchronized time by checking data stored in the loss measurement units when necessary.

On the contrary, FIG. 3 shows a case where each loss measurement unit includes a communication module and thus data communication is performed between the loss measurement units or via a main control unit 50. That is, FIG. 3 shows a system configuration when the loss measurement unit in FIG. 2 includes a communication module 160 for data communication.

FIG. 3 shows the loss measurement unit 100a according to a second embodiment and may include the communication module 160 network-connected to the main control unit 50 or a second loss measurement unit 100b.

In this case, the main control unit 50 has location information or identification information on each of the loss measurement units and may receive the voltage value and/or current value measured by each of the loss measurement units when necessary or regularly. In this case, the main control unit 50 may calculate a loss in power between the loss measurement units and accurately track a trend in power loss.

However, the loss measurement unit according to an embodiment does not necessarily include the communication module, and it is possible to track power loss through the process of comparing and calculating the values of other loss measurement units at the same time because measured voltage values and current values are recorded in the storage unit 150 when there is a user request or regularly.

Figure 4:
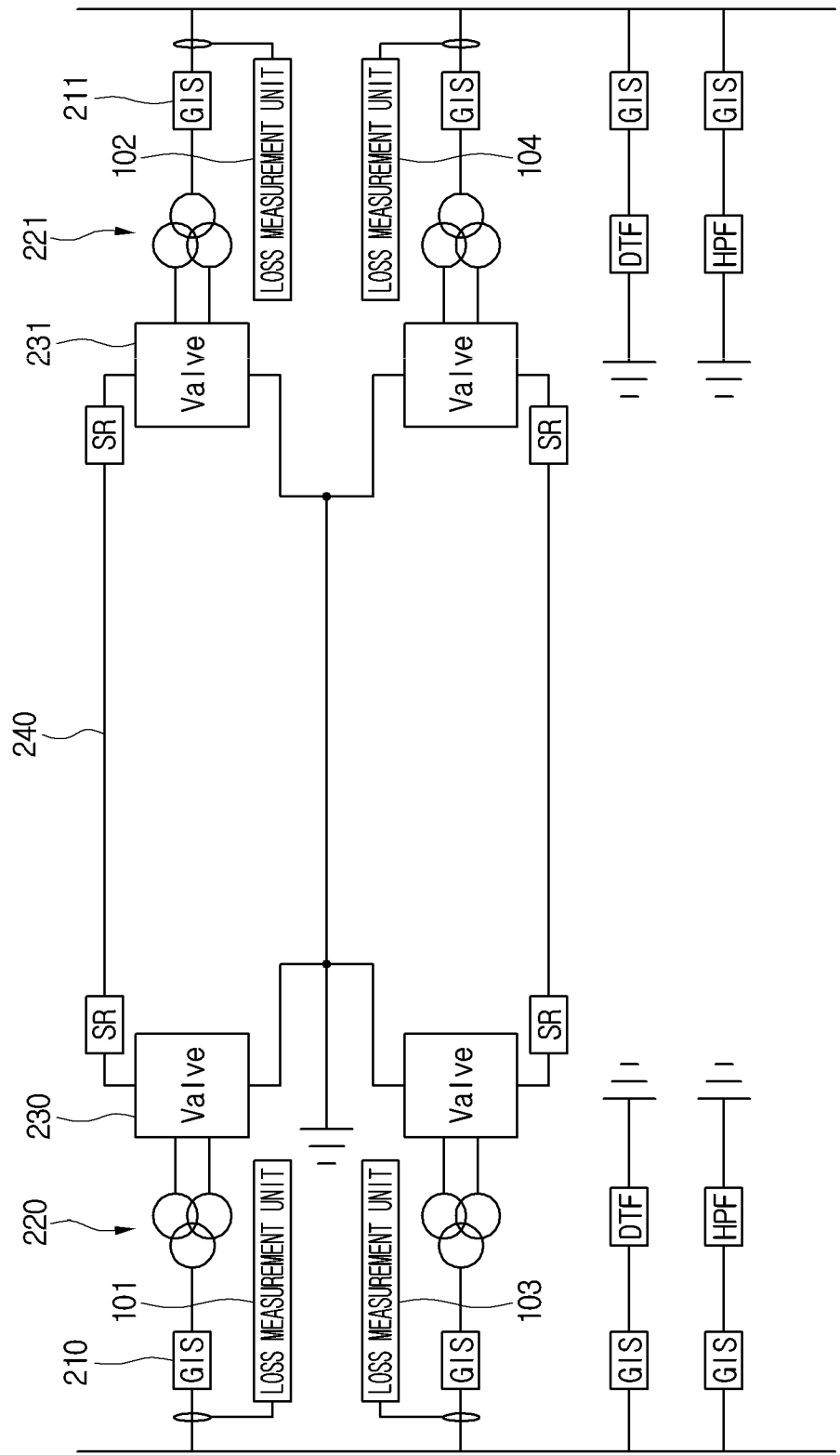
FIGS. 4, 5 and 6 show embodiments where loss measurement units according to an embodiment are installed at many locations in an HVDC system.
Figure 5:
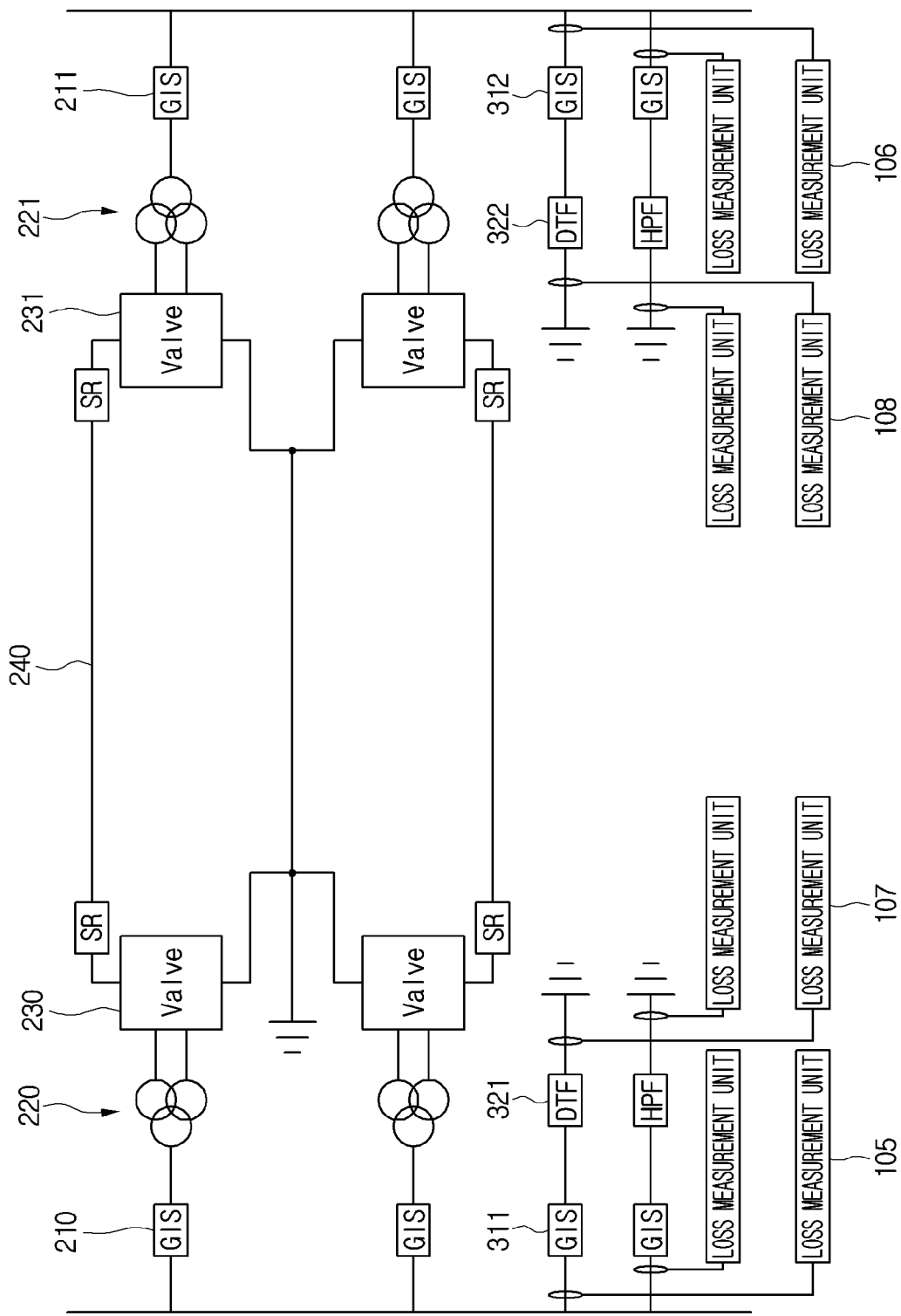
Figure 6:
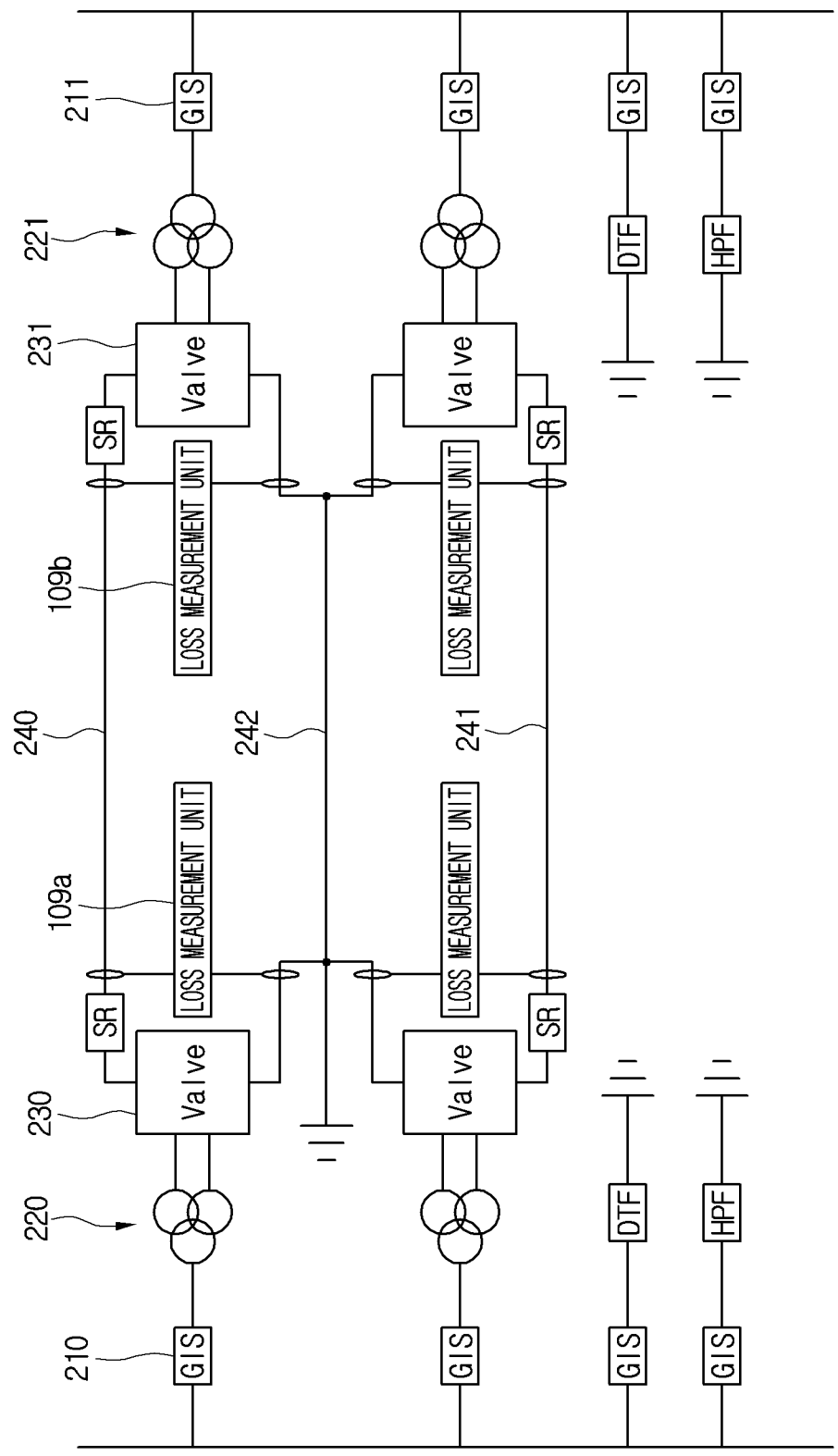

FIGS. 4 to 6 show embodiments where loss measurement units according to an embodiment are installed at many locations in an HVDC system.

Firstly, the configuration of the HVDC system is discussed with reference to FIG. 4. The components of a power transmission side and a power reception side are provided to correspond to each other, in which case the power transmission side includes a power transmission side transformer gas insulated switchgear (GIS) 210 functioning as a switch, a power transmission side transformer 220 for transforming a voltage according to a turn ratio, and a power transmission side thyristor valve 230 for converting an AC into a DC as a power conversion device. In addition, a power transmission line 240 connecting the power transmission side and the power reception side is included.

For example, when the loss measurement units are installed at the GISs being switching devices as shown in FIG. 4, a first loss measurement unit 101 and a second loss measurement unit 102 may be installed at the transformer GISs 210 and 211 connected to the same power transmission line 240.

That is, the first loss measurement unit 101 may be connected to the power transmission side transformer GIS 210 and the second loss measurement unit 102 may be connected to the output of the power reception side GIS 211. In this case, in order to measure a loss in power between the transformer GISs 210 and 322 on the same power transmission line 240, the first and second loss measurement units 101 and 102 may be installed.

The first loss measurement unit 101 measures the voltage value and current value of power transmitted to the power transmission side transformer GIS 210, and the second loss measurement unit 102 measures the voltage value and current value of the power output from the power reception side GIS 211. By comparing the measurement power of the first and second loss measurement units 101 and 102, it is possible to measure a loss in power between the power transmission side transformer GIS 210 and the power reception side transformer GIS 211.

In addition, a user may install the loss measurement units at the locations as shown in FIG. 4. In this case, it is possible to measure a loss in power between the power transmission side and the power reception side. In addition, it is also possible to check by which component the loss occurs, by further installing a pair of loss measurement units between GISs.

FIG. 5 illustrates when the loss measurement units according to an embodiment are installed at the high pass filter sides of the power transmission side and the power reception side.

Referring to FIG. 5, the HVDC system includes filter GISs 311 and 312 and the loss measurement unit may be connected to each of the filter GISs.

The filter GISs include a power transmission side filter GIS 311 and a power reception side filter GIS 312. In addition, high pass filters (HPF) 321 and 322 are respectively connected to the transformers 220 and 221 in parallel.

For example, the power transmission side HPF 321 the power transmission side transformer 220 are connected in parallel, and the power reception side HPF 322 the power reception side transformer 221 are connected in parallel. In addition, the filter GISs 311 and 312 functioning as switches are provided at the HPFs, respectively. For example, the power transmission side filter GIS 311 is connected to the input of the power transmission side HPF 321. The power reception side HPF 322 is also connected to the filter GIS 312.

In addition, when the loss measurement units 105 are installed at both the HPF and the filter GIS respectively, it is possible to measure and check amounts of loss at the HPF and the filter GIS at a synchronized time.

In addition, it is also possible to check the amount of loss between a specific location on the power transmission side and a corresponding location on the power reception side.

The loss measurement units according to an embodiment are installed at corresponding components of the power transmission side and the power reception side in order to check a power loss in the HVDC system so that it is possible to check a loss in power between corresponding locations.

To this end, it is also possible to provide a plurality of loss measurement units on the power transmission line in order to measure a power loss on the power transmission line, as shown in FIG. 6. As shown in FIG. 6, when the HVDC system includes two poles, it is possible to provide the loss measurement units among a first power transmission line 240, a second power transmission line 241, and a ground line 242 connected to the ground voltage of reference.

For example, a first loss measurement unit 109*a* may be connected to the first power transmission line 240 and the ground line 242 near the power transmission side thyristor valve 230, and a second loss measurement unit 109*b* may be connected to the first power transmission line 240 and the ground line 242 near the power reception side thyristor valve 231.

In this case, by comparing the power values calculated from the voltage values and current values measured by the first loss measurement unit 109*a* and the second loss measurement unit 109*b*, it is possible to detect a power loss on the power transmission line and it is thus possible to accurately find out at which location the power loss mostly occurs.

It is possible to check the performance of the HVDC system by the above-described embodiment, which may guarantee performance for a company providing the HVDC system and a company using the system. That is, by providing the loss measurement unit according to the embodiment in plurality in the HVDC system, there are advantages in that it is possible to accurately find out at which location on the path between the loss measurement units the power loss occurs, and it is possible to accurately calculate a power loss value because the loss measurement units use time information having no difference.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A system for measuring a loss in power between a power transmission side and a power reception side in a high voltage direct current (HVDC) system, the system comprising:
   a first loss measurement unit installed at the power transmission side,
   a second loss measurement unit installed at the power reception side, and
   a main control unit storing identification information on each of the first and second loss measurement units,
   wherein each of the first and second loss measurement units is installed at a respective location at which a current or voltage is measured, and comprises:
   a respective voltage sensor for measuring a voltage,
   a respective current sensor for measuring a current,
   a respective GPS module for providing time information on when measurement is performed by the voltage sensor and the current sensor, and
   a respective storage unit storing the time information along with a voltage value and a current value measured by the voltage sensor and the current sensor,
   wherein the main control unit is configured to;
   receive the respective voltage and current values measured by each of the first and second measurement units, and
   calculate a loss in power between the first and second loss measurement units according to the received voltage and current values.

2. The system according to claim 1, wherein the first and second loss measurement units are configured to store identification information identifying the loss measurement units.

3. The system according to claim 1, wherein:
   each of the first and second loss measurement units further comprises a respective communication module enabling data communication with an external device or the main control unit, and the first and second loss measurement units are configured to transmit respective measured time information along with the respective measured current values and the voltage value regularly values via the respective communication module.

4. The system according to claim 1, wherein the HVDC system comprises a power transmission side transformer and a power reception side transformer transforming a voltage according to a turn ratio, a power transmission side transformer gas insulated switchgear (GIS) being a switching device provided at the input of the power transmission side transformer, and a power reception side transformer GIS being a switching device provided at the output of the power reception side transformer, and the first loss measurement unit is connected to the input of the power transmission side transformer GIS, and the second loss measurement unit is connected to the output of the power reception side transformer GIS.

5. The system according to claim 1, wherein the HVDC system comprises a power transmission side high pass filter (HPF) and a power reception side HPF for removing a high frequency component, a power transmission side filter GIS being a switching device provided at the input of the power transmission side HPF, and a power reception side filter GIS being a switching device provided at the output of the power reception side HPF, and the first loss measurement unit is connected to the input of the power transmission side filter GIS, and the second loss measurement unit is connected to the output of the power reception side filter GIS.

6. The system according to claim 1, wherein:

the HVDC system comprises a power transmission line connecting thyristor valves of the power transmission side and the power reception side, and a ground line to which a ground voltage is applied, each of the first and second loss measurement units is configured to connect the power transmission line and the ground line, the first loss measurement unit is provided at the power transmission side thyristor value side, and the second loss measurement unit is provided at the power reception side thyristor value side.

7. The system according to claim 1, further comprising:

a power transmission side loss measurement unit connected to the input of the power transmission side transformer, and a power reception side loss measurement unit connected to the output of the power reception side transformer.

8. A loss measurement system for an HVDC system, the loss measurement system comprising:

a power transmission side transformer installed at a power transmission side transmitting power to a power reception side, a power transmission side thyristor valve converting a voltage output from the transformer, a power transmission side HPF connected to the power transmission side transformer in parallel and removing a high frequency component of the power, a power transmission side loss measurement unit connected to the HPF and measuring a voltage value or current value, a power transmission line connecting the power transmission side to the power reception side, a power reception side thyristor valve installed at the power reception side and connected to the power transmission line, a power reception side transformer connected to the thyristor valve, a power reception side HPF connected to the power reception side transformer in parallel and removing a high frequency component of the power output from the power reception side transformer, a power reception side loss measurement unit connected to the power reception side HPF and measuring a voltage value or current value, a main control unit storing identification information on each of the power transmission side loss measurement unit and the power reception side loss measurement unit, wherein each of the power transmission loss measurement unit and the power reception side loss measurement unit comprises:

a respective sensor for measuring a voltage or current, a respective GPS module for providing time information on when measurement is performed by the sensor, and a respective storage unit storing the time information along with a voltage value and a current value measured by the sensor, wherein the main control unit configured to receive the respective voltage and current values measured by each of the power transmission side loss measurement unit and the power reception side loss measurement unit, and calculate a loss in power between the power transmission side loss measurement unit and the power reception side loss measurement unit according to the received voltage and current values.

9. The loss measurement system according to claim 8, further comprising:

a power transmission side filter GIS connected to the power transmission side HPF and performing a switching function, a power reception side filter GIS connected to the power reception side HPF and performing a switching function, wherein the power transmission side loss measurement unit installed at both the power transmission side HPF and filter GIS.

10. The loss measurement system according to claim 9, wherein the power reception side loss measurement unit installed at both the power reception side HPF and filter GIS.

11. The loss measurement system according to claim 8, further comprising:

a ground line which connects the power reception side and the power transmission side and to which a ground voltage is applied, and first and second loss measurement units, each being connected to the power transmission line and the ground line, wherein the first loss measurement unit is provided at a power transmission side thyristor valve side and the second loss measurement unit is provided at a power reception side thyristor valve side.

* * * * *